US 6,550,662 B2

(12) United States Patent
Too

(10) Patent No.: US 6,550,662 B2
(45) Date of Patent: Apr. 22, 2003

(54) CHIP REWORK SOLDER TOOL

(75) Inventor: Heng-Kit Too, San Diego, CA (US)

(73) Assignee: Kyocera Wireless Corporation, San Diego, CA (US)

( * ) Notice: Subject to any disclaimer, the term of this patent is extended or adjusted under 35 U.S.C. 154(b) by 0 days.

(21) Appl. No.: 09/825,003

(22) Filed: Apr. 3, 2001

(65) Prior Publication Data

US 2002/0139832 A1 Oct. 3, 2002

(51) Int. Cl.[7] .............. B23K 5/00; B23K 1/08; B23K 37/06; B23K 32/00
(52) U.S. Cl. ............ 228/39; 228/33; 228/180.22
(58) Field of Search ............ 228/180.22, 191, 228/264, 33, 39, 41, 245, 296, 180.2, 180.21; 29/740, 830

(56) References Cited

U.S. PATENT DOCUMENTS 4,985,107 A * 1/1991 Conroy et al. ............ 118/504
5,381,848 A * 1/1995 Trabucco .................. 164/102
5,403,671 A * 4/1995 Holzmann ................ 174/261
5,746,127 A * 5/1998 Fischbeck et al. ........ 101/123
5,759,269 A * 6/1998 Cutting et al. ............ 101/123
5,895,554 A * 4/1999 Gordon .................... 156/556
5,946,546 A * 8/1999 Fillon et al. .............. 324/765
6,029,882 A * 2/2000 Bolde et al. ........... 228/180.22
6,042,412 A * 3/2000 Murr .................... 228/180.22
6,182,883 B1 * 2/2001 Nikmanesh ................ 228/33
6,292,003 B1 * 9/2001 Fredrickson et al. ...... 324/754
6,316,289 B1 * 11/2001 Chung ..................... 438/118
6,386,436 B2 * 5/2002 Hembree ................ 228/179.1

* cited by examiner

Primary Examiner—M. Alexandra Elve
Assistant Examiner—L. E. Edmondson
(74) Attorney, Agent, or Firm—MacPherson Kwok Chen & Heid LLP

(57) ABSTRACT

A tool for applying solder paste to leadless chips has recesses adapted to receive the leadless chips. Apertures in each recess are arranged according to pads on the leadless chip. With the chips held in the recesses, solder paste is applied in the apertures.

8 Claims, 2 Drawing Sheets

CHIP REWORK SOLDER TOOL

BACKGROUND

1. Field of Invention

The invention relates generally to electronics rework, and more particularly to a solder tool for rework of high-density circuits and methods of using the same.

2. Related Art

To meet the demand for advanced electronic devices such as wireless handsets and personal digital assistants (PDAs), manufacturers are continually increasing the density of packaged integrated circuits. For example, chip scale package technologies provide a small footprint on the printed circuit board (PCB), allowing manufacturers to pack more electronics into a given space. One type of chip scale package, known as the Bump Chip Carrier™ (BCC) has become quite popular for use in wireless handsets not only because of its small footprint but because of superior RF properties. The BCC design does not use traditional pins or leads to connect the chip to its PCB. Instead, a BCC chip has conducting pads (the "bumps") that attach to solder on the PCB. A similar leadless design is found in land grid array chip packages. Other leadless packaging devices are known and used in the electronics field.

Before a board is populated with such leadless chips, a stencil is typically used to apply solder to pads on the board that correspond with I/O pads on the chip. When IC chips are placed on the board, the solder paste assists in adhering the chips to the board. Upon heating, the chips' pads bond to the solder on the board.

The resulting populated boards may be relatively expensive. For example, a populated board designed for use in a wireless handset often may exceed $50 in cost to manufacture. Unfortunately, some of the populated boards do not function properly. Quite often, such failures result from just a single IC chip malfunctioning or being misplaced on the board. Discarding a populated board merely because a single IC chip on the board is non-functional would thus be wasteful. Rather than discarding boards having a defective IC chip, an attempt is made to replace the defective chip in a process known as rework.

The rework process, which has always been labor intensive, is made even more difficult when using high-density leadless chips. For example, once a defective IC chip is removed from the board, the original stencil used for soldering the board cannot be reused because of the other functional chips still attached to the board. Instead, a rework technician must place a smaller stencil onto the space originally occupied by the defective chip. The technician must place the stencil, carefully apply solder paste, position a new IC chip, and heat the repopulated board to activate the solder. Because modern boards typically have very fine pitch (the spacing between traces) to save space, the proper positioning of this smaller stencil is very difficult to achieve. Further, it is difficult for the technician to accurately control the amount and placement of the solder paste. For example, adding just a little too much solder paste, or positioning the stencil slightly off target may result in a short circuit between pads on the chip. Such a short or other malfunction causes the rework attempt to fail and the entire board and the new IC chip are thereby generally discarded. In this fashion, the value of the board and chip is lost, the rework labor wasted. Because of these rework difficulties, even a skilled technician rarely achieves better than a 10% rework success rate for fine-pitch BCC-populated boards.

Accordingly, there is a need in the art for improved rework tools and techniques for boards populated by leadless integrated circuits.

SUMMARY

It is desirable to rework a circuit board having a defective leadless chip without requiring the use of a stencil to apply solder paste to the board. It is therefore an object of the invention to provide a tool that can be used to enable efficient rework using high-density electronic packages. The resulting soldered chips may be placed and secured on the board.

To overcome the disadvantage in the prior art and meet the objectives of this invention, a solder paste tool and method for using the same is herein disclosed and claimed.

The tool comprises a plate having recesses adapted to receive leadless chips. Within each recess, apertures are arranged according to pads on the leadless chips. To use the tool, the leadless chips are placed in the recesses. Solder paste may then be applied through the apertures to a portion of the chip pads. Upon heating, the applied solder paste forms solder balls on the pads of the leadless chips.

Advantageously, the rework solder tool enables efficient rework of high density chip packages. The rework solder tool may be used to obtain a more precise and controlled arrangement of solder on a high-density chip. In such a manner, the pre-soldered chip may be more efficiently and accurately positioned on a printed circuit board. Accordingly, the rework solder tool provides the desirable result of having fewer discarded boards, and a higher return of rework resources as compared to known rework systems.

BRIEF DESCRIPTION OF THE DRAWINGS

FIG. 3 is a cross-sectional view taken on line 3—3 of FIG. 1a.

Use of the same or similar reference numbers in different figures indicates same or like elements.

DETAILED DESCRIPTION OF THE PREFERRED EMBODIMENTS

Figure 1:
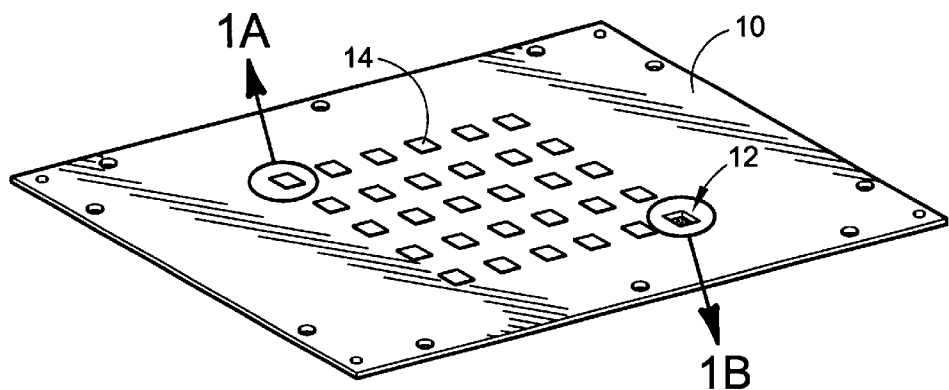
FIG. 1 is a perspective view of the solder rework tool according to one embodiment of the invention.
Figure 1A:
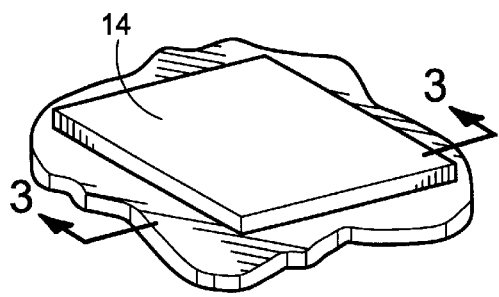
FIG. 1a illustrates a recess of the solder rework tool of FIG. 1 receiving a leadless chip.
Figure 1B:
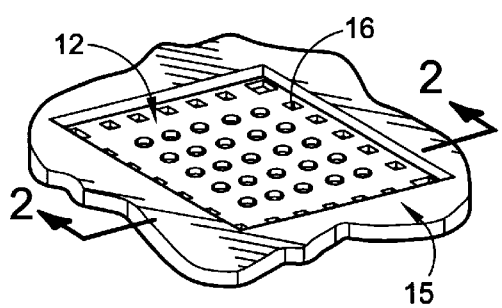
FIG. 1b illustrates an unoccupied recess of the solder rework tool of FIG. 1.
Figure 2:
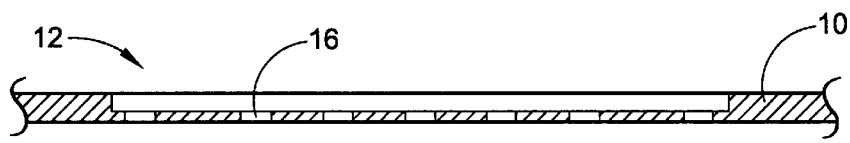
FIG. 2 is a cross-sectional view taken on line 2—2 of FIG. 1b.
Figure 3:
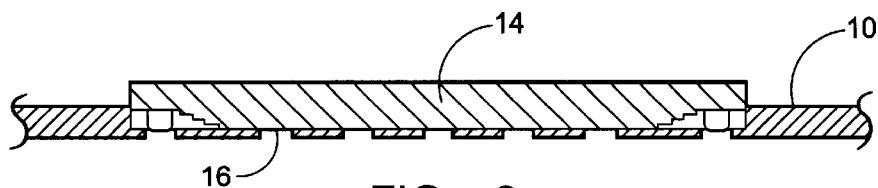

Referring now to FIGS. 1 through 3, a tool and method is illustrated for enabling efficient rework of a high-density chip package. The illustrated example uses a plate 10 to apply solder paste to a leadless replacement chip prior to rework. The plate 10 achieves superior rework results. More particularly, the plate 10 eliminates the need for a stencil to apply solder paste to a partially-populated board and the resulting low success rates previously discussed.

Plate 10 includes recesses 12 configured to receive a leadless chip 14 having unsoldered pads such as a land grid array, MLF, or BCC chip. Within each recess 12, a template 15 formed by apertures 16 permits the application of solder paste to the chip 14. Plate 10 may have any arbitrary plurality of recesses 12, allowing the simultaneous application of solder paste to the corresponding plurality of chips 14. In this manner, a rework technician could prepare a supply of chips 14 in advance of any rework.

Figure 4:
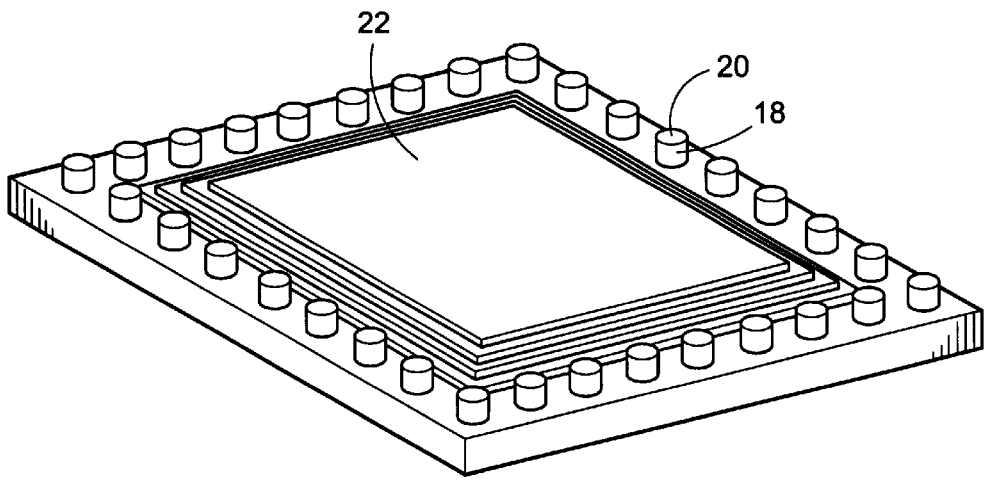
FIG. 4 is a perspective view of a leadless chip before application of solder paste using the solder rework tool of FIG. 1.
Figure 5:
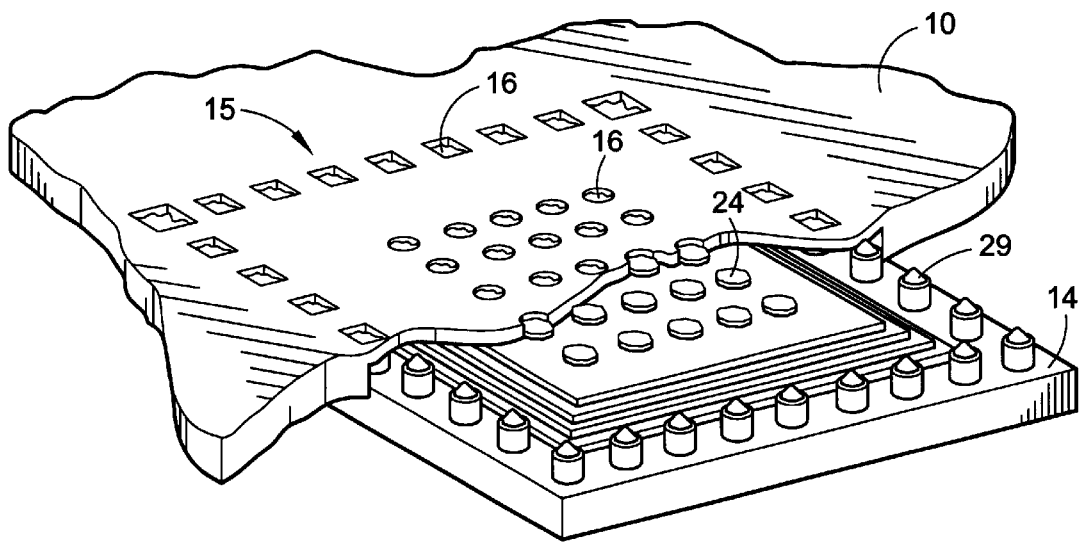
FIG. 5 is a perspective view, partially cut-away, of a leadless chip receiving solder paste using the solder rework tool of FIG. 1.

FIG. 4 shows the "bumps" 18 on a BCC chip 14 prior to application of the solder paste. Each bump 18 includes a conductive pad 20 corresponding to an I/O connection for the chip 14. In addition to the bumps 18, the chip may have a ground plane 22. As seen in FIG. 5, the apertures 16 in the template 15 are arranged according to the pattern established by the pads 20. Other apertures 16 in the template 15 provide an adequate number of solder connections to the ground plane 22. With the chips 14 being held by the plate 10 in its recesses 12, solder paste is forced into the apertures 16. In one embodiment, tape may be used to secure the chips 14 to the plate 10 while the solder paste is forced into the apertures 16. It will be appreciated that other methods may be used to secure the chips to the plate during this application of the solder paste.

With the chips 14 secured in the plate 10, a rework technician may apply the solder paste with a squeegee or other spreading device across the surface of plate 10 opposing the recesses 12. The entire assembly of the plate 10 with its chips 14 may then be placed in an oven to melt the solder. The plate 10 is preferably constructed of materials that the solder does not bond to. Thus, the resulting solder melt in each aperture 14 will tend to shrink away from the walls of the recesses 12, forming a ball of molten solder on each pad 12. Such non-bonding plate materials include stainless steel and brass. It will be appreciated that other non-bonding metal or non-metal materials may be substituted. As the entire assembly is cooled, the molten solder hardens to form solder balls 24 on the pads 12 and the ground plane 22. The plate may then be removed, and the soldered chips set aside should they be required for rework.

The recesses 12 and the apertures 16 may be machined into the plate with a laser machine tool or a chemical etcher. The inventor has discovered that a suitable recess depth is approximately 16 mils with an aperture depth of approximately 6 mils for most applications. The aperture depth may be varied depending upon the size of the solder ball 24 desired. The greater the depth, the larger the resulting solder ball 24. The widths of the apertures are preferably sized approximately 10% smaller than the widths of the pads 20. In this fashion, the resulting solder ball 24 will be retained within the pad's surface.

It will be appreciated that different plates 10 will be constructed according to the different chips 14 that may have to be replaced. For example, should a board be populated with two types of BCC chips and one type of land grid array chips, a rework technician would use three different plates corresponding to the three different chips. Each plate would have its recesses filled by its corresponding chips, the solder paste applied, and then be placed in the oven. In this manner, the technician would have a supply of soldered chips for each required category. If testing indicates a populated board contains a defective chip of these categories, the rework technician removes it, applies flux to the board and replaces the removed chip with a soldered chip. As is known in the art, split beam vision systems permit the technician to precisely place the soldered chip onto the board. Because the board is fluxed, the soldered chip will be held in place as the board is heated, whereupon the solder balls melt, allowing the chip to bond to the board.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

What is claimed is:

1. A chip rework method using a plate having a recess sized to receive a fine-pitch leadless chip, wherein the recess includes apertures placed according to pad locations on the fine-pitch leadless chip, the apertures having a depth suitable for application of solder paste, comprising:

(a) placing the fine-pitch leadless chip in the recess; and
   (b) with the fine-pitch leadless chip in the recess, applying solder paste to the apertures
   (c) heating the plate after the applying act (b) to melt the applied solder paste
   (d) cooling the plate after the heating act (c), whereby solder balls are formed within the pads of the fine-pitch leadless chip;
   (e) testing a populated board to identify a defective fine-pitch leadless chip;
   (f) removing the defective fine-pitch leadless chip from the board; and
   (g) replacing the defective fine-pitch leadless chip with the fine-pitch leadless chip having solder balls formed in act (d).

2. The chip rework method of claim 1, wherein the aperture depth is approximately 6 mils.

3. The chip rework method of claim 1, wherein the fine-pitch leadless chip used in act (a) is a BCC chip.

4. The chip rework method of claim 1, wherein the fine-pitch leadless chip used in act (a) is a land grid array chip.

5. The chip rework method of claim 1, wherein the solder paste is applied in act (b) using a squeegee.

6. A chip rework tool for applying solder paste to a leadless chip, comprising:

a plate having a first surface, the first surface including at least one recess adapted to receive a leadless chip, wherein each recess includes apertures arranged according to pads on the leadless chip, and wherein each aperture has a depth of approximately 6 mils.

7. The chip rework tool of claim 6, wherein the recesses are adapted to receive a BCC chip, the apertures in each recess being arranged according to the pads on the BCC chip.

8. The chip rework tool of claim 6, wherein the recesses are adapted tro receive a land grid array chip, the apertures in each recess being arranged according to the pads on the land grip array chip.

* * * * *